United States Patent [19]

Kawkatsu

[11] Patent Number: 4,783,422

[45] Date of Patent: Nov. 8, 1988

[54] PROCESS FOR FABRICATING A BIPOLAR TRANSISTOR UTILIZING SIDEWALL MASKING OVER THE EMITTER

[75] Inventor: Akira Kawkatsu, Tokyo, Japan

[73] Assignee: Oki Electric Industry Co., Ltd., Tokyo, Japan

[21] Appl. No.: 108,796

[22] Filed: Oct. 15, 1987

[30] Foreign Application Priority Data

Oct. 24, 1986 [JP] Japan .................. 61-252063

[51] Int. Cl.⁴ .................. H01L 21/385; H01L 21/425
[52] U.S. Cl. ...................... 437/31; 437/33; 437/162
[58] Field of Search .................. 437/31, 33, 162

[56] References Cited

U.S. PATENT DOCUMENTS

| | | | |
|---|---|---|---|
| 3,940,288 | 2/1976 | Takagi et al. | 437/31 |
| 4,319,932 | 3/1982 | Jambotkar | 437/162 X |
| 4,408,387 | 10/1983 | Kiriseko | 437/31 |
| 4,431,460 | 2/1984 | Barson et al. | 437/31 |
| 4,481,706 | 11/1984 | Roche | 437/33 |
| 4,495,010 | 1/1985 | Kranzer | 357/34 X |
| 4,546,536 | 10/1985 | Anantha et al. | 437/33 X |
| 4,590,666 | 5/1986 | Goto | 437/33 |
| 4,678,537 | 7/1987 | Ohuchi | 437/31 X |
| 4,721,685 | 1/1988 | Lindenfelser et al. | 437/31 |
| 4,731,341 | 3/1988 | Kawakatsu | 437/33 X |
| 4,735,912 | 4/1988 | Kawakatsu | 437/33 |

Primary Examiner—George T. Ozaki
Attorney, Agent, or Firm—Spencer & Frank

[57] ABSTRACT

In a process for fabricating a semiconductor integrated circuit, a polysilicon layer deposited on the working surface of a silicon substrate is selectively oxidized and the polysilicon oxide layer is partially removed to form an opening. A chemical vapor deposition layer is formed on the entire surface and anisotropic etching of said chemical vapor deposition layer is performed to leave the chemical vapor deposition layer on the sidewall of the opening.

6 Claims, 4 Drawing Sheets

PROCESS FOR FABRICATING A BIPOLAR TRANSISTOR UTILIZING SIDEWALL MASKING OVER THE EMITTER

BACKGROUND OF THE INVENTION

This invention relates to a process for fabricating semiconductor integrated circuit devices capable of high packing density and high-speed operation.

Emitter-coupled logic (ECL) bipolar semiconductor integrated circuit devices, also known as current-mode logic (CML) devices, have commonly been used in semiconductor integrated circuit application fields requiring especially high speed. In an ECL or CML circuit, for a given power consumption and logic swing, the propagation delay time is mainly determined by the parasitic capacitance of the circuit elements and interconnection wiring, and the base resistance and gain-bandwidth product of the transistors. To reduce parasitic capacitance, in particular the base-collector junction capacitance of transistors which make a large contribution to operating speed, it is customary to use polysilicon to lead the base electrode outside the element region thereby to reduce the base region, and to form the polysilicon resistors and metal interconnections on a thick isolation oxide.

To reduce the base resistance, it is necessary to reduce the resistance of the inactive base layer, dispose it as close as possible to the emitter, reduce the width of the emitter, and reduce the resistance of the active base layer under the emitter. Means of improving the gain-bandwidth product include making the base and emitter junctions shallow and the epitaxial collector layer thin.

A fabrication process that has been proposed to achieve these goals is described in Japanese Patent Application Publication No. 131698/1986 and a corresponding U.S. patent application Ser. No. 057,510 filed June 3, 1987, now U.S. Pat. No. 4,735,912.

The steps in this fabrication process are illustrated in FIG. 2A to FIG. 2E, which trace the formation of the cross section of a transistor with a double-base structure, in which base electrodes are located on both sides of the emitter to reduce the base resistance. FIG. 2A shows the state after oxide isolation process has been carried out and the polysilicon and selective oxidation mask have been formed. The parts labeled are a P⁻ type silicon substrate 1, an N+-type buried layer 2, an N⁻-type epitaxial layer 3, an isolation oxide layer 4, an N+-type region 5 for reducing the collector resistance, the polysilicon 6, a nitride film 7 that will become the selective oxidation mask, and a boron-doped layer 8 formed using the nitride film 7 and its patterning resist (not shown in the drawing) as a mask. The polysilicon 6 is selectively oxidized and the nitride film 7 is removed, then the surface of the remaining polysilicon 6 is oxidized, giving the structure shown in FIG. 2B. In this structure the electrodes of the transistor are formed by the polysilicon regions 6a to 6d, which are isolated from one another by an oxide film 9. The boron-doped layer 8 is diffused by heat treatment during this process and becomes a moderate-doped p-type layer forming part of the inactive base. Next, using a resist not shown in the drawing, a high-dosage implant of boron ions is performed on the polysilicon regions 6a and 6c that will become the base electrodes. After the resist is removed, the entire surface is given a low-dosage boron ion implant.

This is followed by heat treatment in a non-oxidizing atmosphere, forming a heavily-doped inactive base 10 and an active base 11 by diffusion from the polysilicon as shown in FIG. 2C. These base regions 10 and 11 are linked by the region 8, which is doped at a moderate concentration. Next contact holes are opened as in FIG. 2C and a slight oxidation is performed on the polysilicon exposed at the contact holes as shown in FIG. 2D. Then, using a mask not shown in the drawings, arsenic ions are implanted into the polysilicon regions 6b and 6d and heat treatment is performed to form the emitter 12. Next the thin oxide is removed and metal electrodes 13a to 13d are formed. With this process it is possible to form shallow junctions of the active base 11 and the emitter 12 and obtain a fairly high-performance transistor.

It is not possible, however, to reduce the base resistance as much as desired because the heavily-doped inactive base 10 and the emitter 12 are separated by the moderately-doped base 8, and resistance in this region cannot be made adequately low. Furthermore, the heat treatment in the selective oxidation of the polysilicon extends the moderately-doped base 8 under the emitter 12, narrowing the active base 11. This leads to considerable recombination of the carriers injected into the base from the emitter, making it difficult to increase the current gain. This tendency worsens at reduced feature sizes, imposing a limit on the shrinkage of the transistor geometry. Also, since the moderately doped base 8 has a deep junction, there are limits to the thinning of the epitaxial layer, creating an obstacle to improvement of the gain-bandwidth product. All of the problems described above can be ascribed to the moderately-doped base 8.

SUMMARY OF THE INVENTION

An object of the present invention is to eliminate these problems in the reduction of the base resistance, reduction of junction capacitance, enhancement of current gain, and improvement of gain-bandwidth product, and provide a process for the fabrication of semiconductor integrated circuit devices that are small in size and excel in high-speed operation.

In the semiconductor integrated circuit fabrication process of this invention, the base electrode is formed by selective oxidation of polysilicon deposited on a silicon substrate. This polysilicon is heavily doped with boron. The polysilicon oxide is removed from the emitter region to form an opening there and the exposed substrate surface is oxidized and a heavily-doped inactive base is formed by diffusion from the polysilicon. An active base is formed adjacent to the inactive base by boron ion implantation. Next a chemical vapor deposition (CVD) layer is grown over the whole surface, then etched by reactive ion etching to leave the CVD layer on the sidewall of the opening. An emitter window is opened using the CVD layer on the sidewall as a mask, and the emitter is formed in the active base by diffusion from arsenic doped polysilicon.

In this invention the base resistance is reduced because the heavily-doped inactive base is close to the emitter, an the base-collector junction capacitance is reduced because the base area is reduced in size. This reduction of the junction capacitance also reduces all the time constants, and improves the gain-bandwidth product.

DETAILED DESCRIPTION OF THE EMBODIMENTS

Figure 1A:
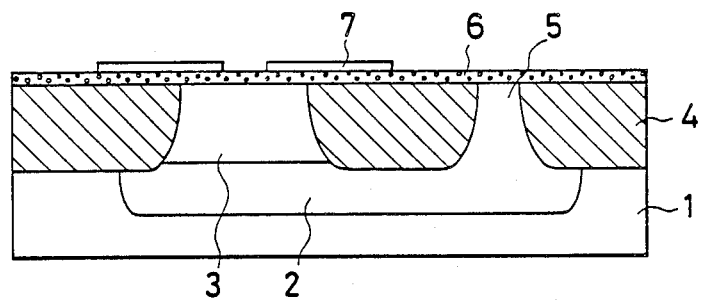
FIG. 1A to FIG. 1F illustrate the fabrication process in an embodiment of this invention.
Figure 1B:
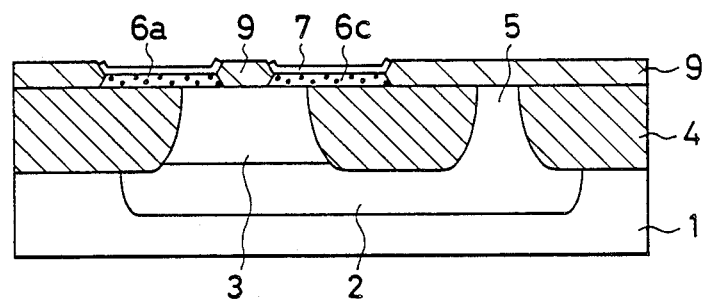
Figure 1C:
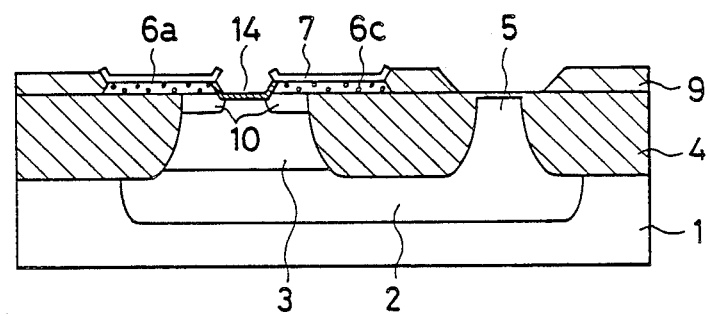
Figure 1D:
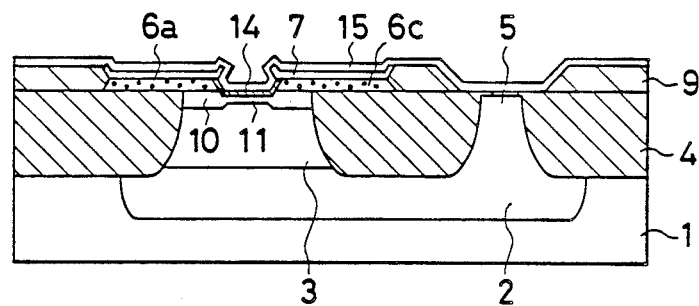
Figure 1E:
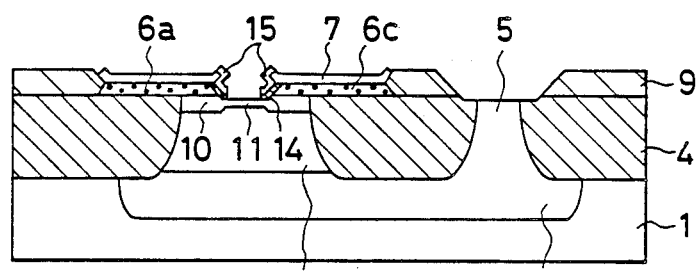
Figure 1F:
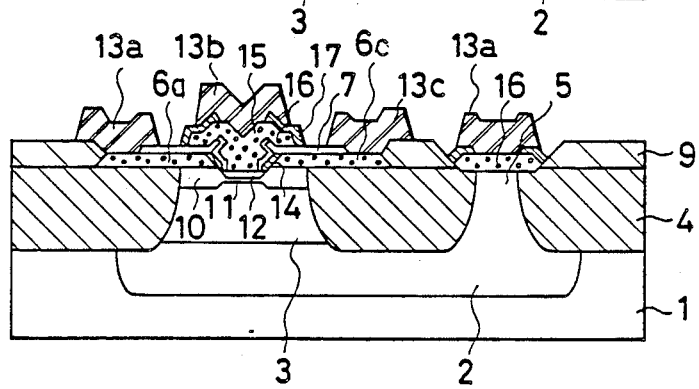
Figure 2A:
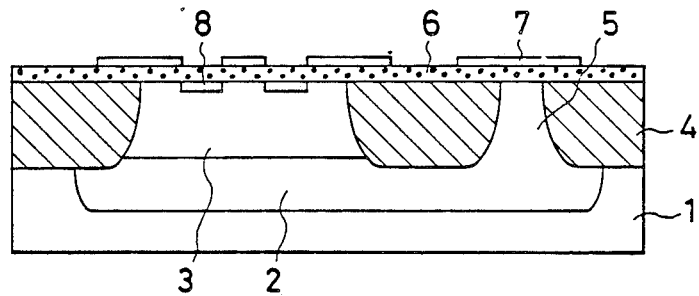
FIG. 2A to FIG. 2E illustrate the fabrication process of the prior art.
Figure 2B:
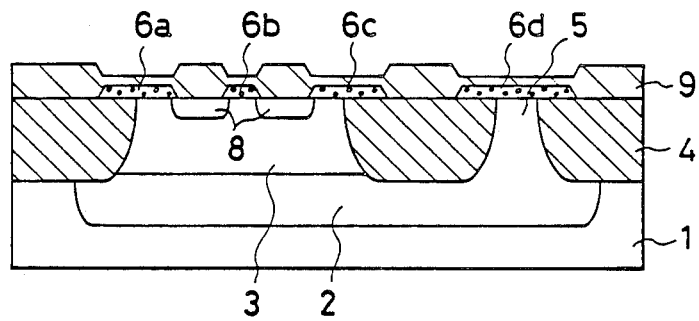
Figure 2C:
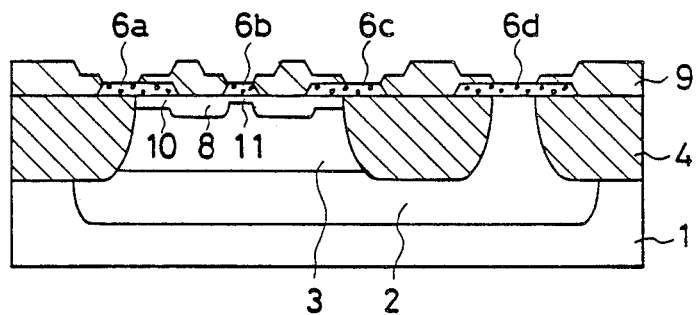
Figure 2D:
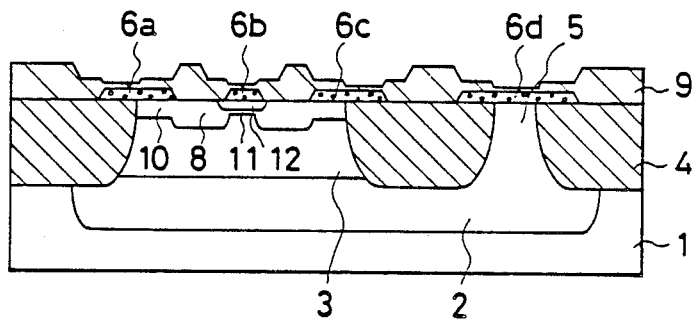
Figure 2E:
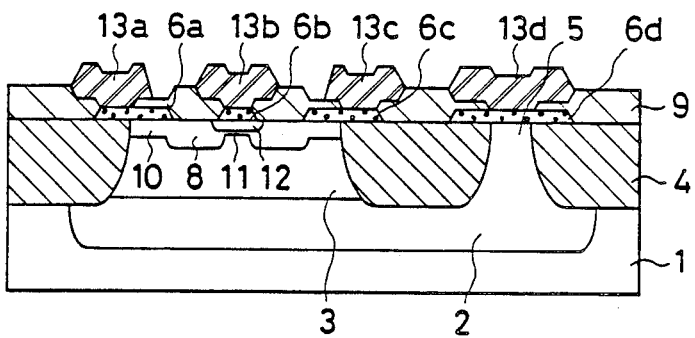

An embodiment of this invention will be described with reference to the drawings. FIGS. 1A to 1F illustrate the fabrication steps in this embodiment. First, as shown in FIG. 1A, after the oxide isolation step, 2000 Å to 3000 Å of polysilicon 6 are formed on a silicon substrate 1 in which an N+-type region 5 has been formed. The surface of the polysilicon 6 is oxidized to a thickness of about 200 Å, and a nitride film 7 1000 Å to 2000 Å thick is formed selectively in the portions at which the base electrode will be formed. Next the polysilicon 6 is selectively oxidized as in FIG. 1B, forming polysilicon regions 6a and 6c that are linked each other like a ring (Surrounding a polysilicon oxide 9). Boron ions are implanted in polysilicon regions 6a and 6c through the nitride film 7 at a dosage of $10^{15} cm^{-2}$ to $10^{16} cm^{-2}$. Next, as shown in FIG. 1C, the oxide 9 is selectively removed to form openings exposing the surface of the silicon substrate 1 at the regions that will become the emitter and collector. (Actually it is the surface of the N+ region 5 etc. that is exposed.) These surfaces and the exposed surfaces of the polysilicon regions 6a and 6c are thermally oxidized to form an oxide film 14 approximately 1000 Å thick. This process also diffuses boron from the polysilicon regions 6a and 6c to form a heavily-doped inactive base 10. Next boron ions are implanted through the oxide film 14 at a dosage of 1 to $5 \times 10^{13} cm^{-2}$; and annealing is performed to form an active base 11 adjacent to the inactive base 10 as in FIG. 1D, and a chemical vapor deposition (CVD) layer 15 of nitride film 1000 to 2000 Å thick is formed on the entire surface. This CVD layer 15 is next etched by reactive ion etching. The CVD layer 15 remaining on the sidewall of the opening where the emitter will be formed acts as a mask for subsequent etching of the oxide film 14 to form the emitter window. The window for the collector contact is also opened at this time, giving the structure shown in FIG. 1E. Next an arsenic-doped polysilicon layer 16 is created, 2000 Å to 4000 Å thick. Thermal oxidation is performed to form an oxide layer 17 and arsenic is diffused simultaneously to form the emitter 12. Finally, contact holes are opened and the metal electrodes 13a to 13d are formed in FIG. 1F.

In this embodiment the CVD layer 15 was a nitride layer, but polysilicon could be used instead, or a compound layer could be used consisting of a nitride or polysilicon layer overlying a thin oxide layer. This last arrangement can prevent over-etching since the thin CVD oxide layer acts as a stopper for reactive ion etching of the upper layer. This compound layer is suitable for obtaining a narrow emitter, because the width of the emitter window can be easily controlled by varying the thickness of the upper layer. This invention also permits other variations in the embodiment described above: for example, the formation of the active base 11 in the process in FIG. 1D can be omitted to create a static induction transistor.

As described above, the fabrication process of this invention reates the emitter in a selectively oxidized polysilicon region, with the heavily-doped inactive base formed by diffusion from the polysilicon remaining next to the oxidized region, so the space between the heavily-doped inactive base and the emitter can be greatly reduced and an emitter with a narrow width can easily be formed. The base resistance can therefore be reduced much more than before. In the prior art, when the widths of the emitter, the moderately-doped base, and the heavily-doped inactive base were all the minimum feature size, the width of the entire base region was five times the minimum feature size; in this invention it is only three times the minimum feature size. The base-collector junction capacitance is thus reduced to about 60% the previous level. Furthermore, in the prior art there was a large junction contact area between the emitter and the moderately-doped base, whereas in this invention all or almost all of the base-emitter junction is a junction between the emitter and the lightly-doped active base, so the emitter can be smaller in width than before, and the emitter-base junction capacitance is reduced. Also, in the prior art the depth of the moderately-doped base junction limited the thinning of the epitaxial layer, but in this invention there is no such deep junction, so the epitaxial layer can be made as thin as 1um or less, reducing the transit time of carriers in the collector depletion region. The reduction of the junction capacitance seen above also reduces the collector and emitter time constants, and all these factors serve to improve the gain-bandwidth product. This invention, accordingly, reduces the base resistance and parasitic capacitance of the transistor, improves the gain-bandwidth product, and therefore enables extremely high-speed operation.

In the prior art, because the moderately-doped base extended below the emitter, reduction of the feature size reduced the ratio of the active base area to the emitter area, making it difficult to obtain a high current gain, but in this invention there is almost no intrusion of the inactive base below the emitter, so a high current gain can be obtained and the feature size can easily be reduced.

In the prior art the entire surface of epitaxial layer is doped with boron, so a special step is required to create a lateral PNP transistor, but in this invention if the polysilicon 6a and 6c are separated and the oxide between the polysilicon regions is not removed (see FIG. 1B and FIG. 1C), a lateral PNP transistor is formed automatically using exactly the same process as for an NPN transistor.

As seen above, this invention is widely applicable to high-speed semiconductor integrated circuit devices with high packing density. It can greatly increase the operating speed of ECL/CML circuits, and can be used in TTL circuits and analog (linear) circuits which employ large numbers of lateral PNP transistors.

What is claimed is:

1. A process for fabricating a semiconductor integrated circuit device comprising:
   (a) a step of selectively oxidizing a polysilicon layer deposited on the working surface of a silicon substrate;
   (b) a step of partially removing the polysilicon oxide layer to form an opening;
   (c) a step of forming a chemical vapor deposition layer on the entire surface; and
   (d) a step of anisotropic etching of said chemical vapor deposition layer to leave the chemical vapor deposition layer on the sidewall of the opening.

2. A process as set forth in claim 1, further comprising:
(e) a step of forming an emitter window using the chemical vapor deposition layer as a mask.

3. A process as set forth in claim 2, wherein the chemical vapor deposition layer is a compound layer comprising a silicon nitride layer or a polysilicon layer on a silicon oxide layer.

4. A process for fabricating a semiconductor integrated circuit device comprising:
(a) a first step of depositing polysilicon on a silicon substrate having an island region of a first conduction type on its working surface, and of forming an oxidation-resistant film on selected areas of this polysilicon;
(b) a second step of selectively oxidizing the polysilicon, and introducing an impurity of a second conduction type into the remaining polysilicon through the oxidation-resistant film;
(c) a third step of selectively removing a portion of the polysilicon oxide film to form an opening exposing part of the island region;
(d) a fourth step of forming a thin oxide film on the exposed island region and its polysilicon sidewalls, and of forming a first region of the second conduction type in the unexposed island regions;
(e) a fifth step of introducing an impurity of the second conduction type into said island region through said thin oxide film, and of forming a second region of the second conduction type adjacent to the first region;
(f) a sixth step of forming a chemical vapor deposition layer on the entire surface and performing anisotropic etching to leave the chemical vapor deposition layer on the sidewall of the opening;
(g) a seventh step of etching sid thin oxide film using the remaininng chemical vapor deposition layer as a mask, and exposing the surface of the second region; and
(h) an eighth step of forming a third region of the first conduction type, using the impurity of the first conduction type from the exposed surface of the second region.

5. A process as set forth in in claim 4, wherein the chemical vapor deposition layer is a compound layer comprising a silicon nitride layer or a polysilicon layer on a silicon oxide layer.

6. A process as set forth in claim 4, wherein the first conduction type is the N type, the second conduction type is the P type, the impurity of the first conduction type is arsenic, and the impurity of the second conduction type is boron.

* * * * *